(12) United States Patent
Hsu

(10) Patent No.: US 11,798,909 B2
(45) Date of Patent: Oct. 24, 2023

(54) SEMICONDUCTOR PACKAGE STRUCTURE AND MANUFACTURING METHOD THEREOF

(71) Applicant: Phoenix Pioneer Technology Co., Ltd., Hsinchu County (TW)

(72) Inventor: Che-Wei Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 93 days.

(21) Appl. No.: 17/385,991

(22) Filed: Jul. 27, 2021

(65) Prior Publication Data

US 2022/0045025 A1 Feb. 10, 2022

(30) Foreign Application Priority Data

Aug. 4, 2020 (TW) .................................. 109126322

(51) Int. Cl.
*H01L 23/00* (2006.01)
*H01L 25/07* (2006.01)
*H01L 25/00* (2006.01)

(52) U.S. Cl.
CPC .............. *H01L 24/23* (2013.01); *H01L 24/19* (2013.01); *H01L 25/072* (2013.01); *H01L 25/50* (2013.01); *H01L 2224/24011* (2013.01)

(58) Field of Classification Search
None
See application file for complete search history.

(56) References Cited

FOREIGN PATENT DOCUMENTS

| CN | 111627865 A | * | 9/2020 | ......... H01L 21/4814 |
| TW | 1733544 B | * | 7/2021 | |

* cited by examiner

*Primary Examiner* — Telly D Green
(74) *Attorney, Agent, or Firm* — McClure, Qualey & Rodack, LLP

(57) ABSTRACT

The present invention provides a semiconductor package structure including a first dielectric layer, an integrated chip, a second power chip, a first patterned conductive layer, a second patterned conductive layer, a first conductive adhesive part, a second conductive adhesive part, a plurality of first conductive connecting elements and a plurality of second conductive connecting elements, and including a build-up circuit structure below, wherein the integrated chip includes a control chip and a first power chip. By means of integrating the control chip and the first power chip into a single chip, volume of semiconductor package structure can be further reduced. In addition, a manufacturing method of a semiconductor package structure is also provided.

7 Claims, 14 Drawing Sheets

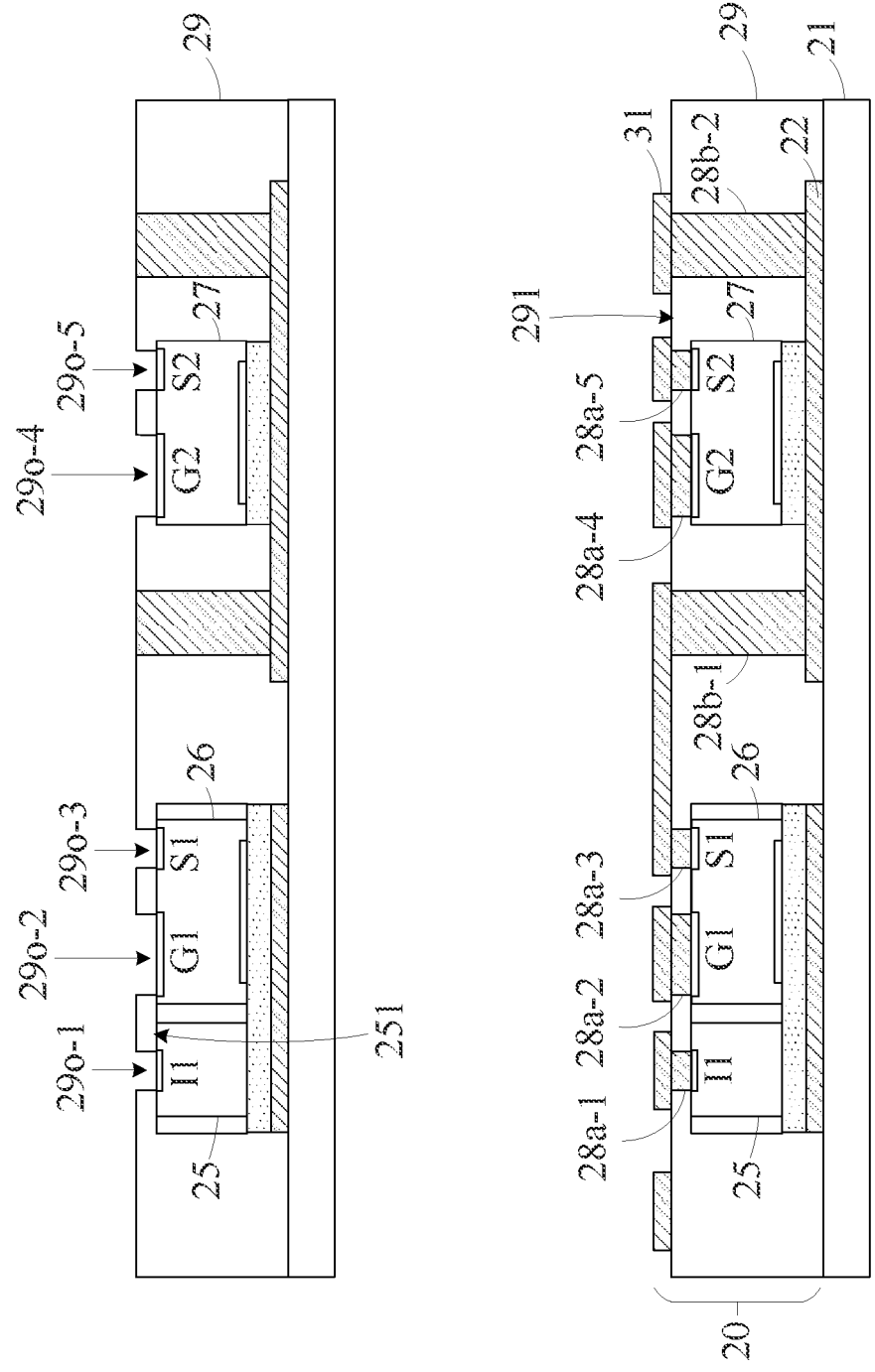

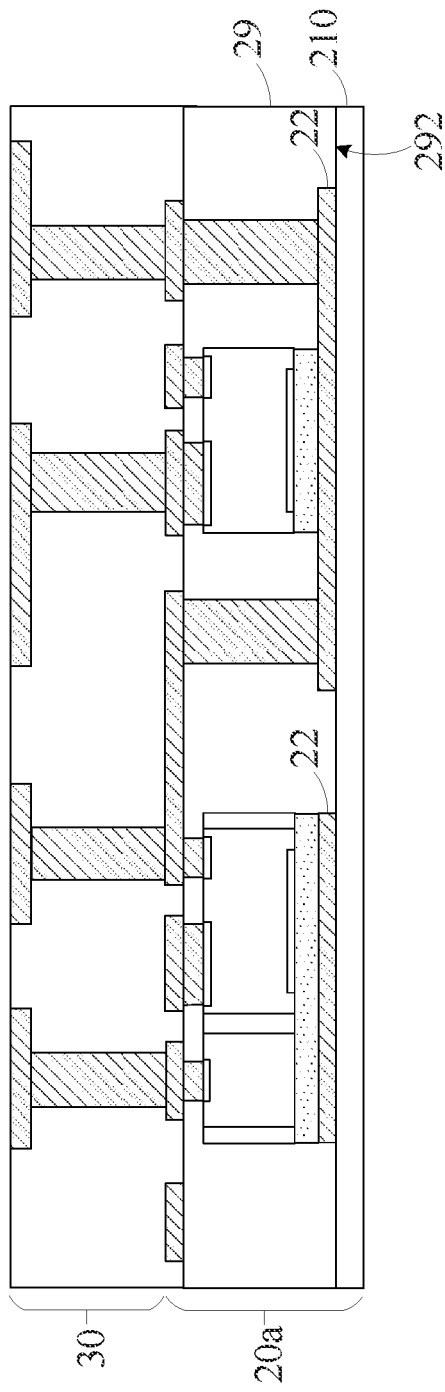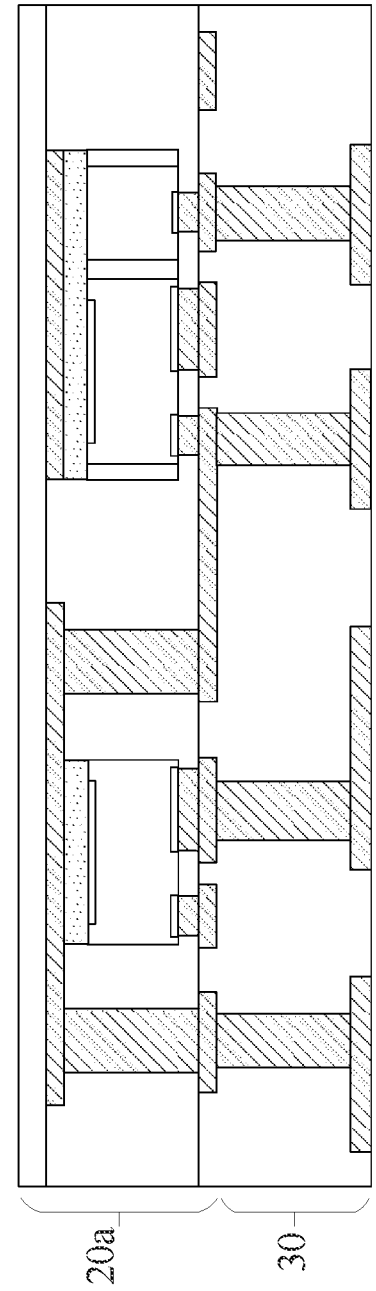
FIG. 3L
FIG. 3M

SEMICONDUCTOR PACKAGE STRUCTURE AND MANUFACTURING METHOD THEREOF

CROSS REFERENCE TO RELATED APPLICATIONS

This Non-provisional application claims priority under 35 U.S.C. § 119(a) on Patent Application No. 109126322 filed in Republic of China on Aug. 4, 2020, the entire contents of which are hereby incorporated by reference.

BACKGROUND OF THE INVENTION

Field of the Invention

The present invention relates to a semiconductor package structure and a manufacturing method thereof, and particularly to a package structure with the power component and the driver component and a manufacturing method of the above package structure.

Descriptions of the Related Art

With the substantial increase in demand for information and automobile electronics, the Quad Flat No-Lead (QFN) package structure has become an important semiconductor packaging technology. Because the QFN package structure has better heat dissipation effect, lower impedance value and lower electromagnetic interference.

In the manufacturing process of the QFN package structure, the cooper clip technology is a technology produced in response to high-power requirements. The copper sheet is designed into an arch bridge shape with a height difference, and the solder dispenser process is used to join the copper sheet to a chip. As a result, the QFN package structure has a small impedance to bear large currents, and can withstand deformation caused by thermal stress, and can be applied to the high power components such as transistors.

Hereinafter, please refer to FIGS. 1A to 1D to briefly explain the part of the conventional package structure that uses copper clip technology to join the transistors.

As shown in FIG. 1A, a solder paste layer 102 is formed on a lead frame 101 with screen process technology. Next, as shown in FIG. 1B, a transistor chip 103 is disposed on the solder paste layer 102. Then, as shown in FIG. 1C, the solder paste 104 is formed on the transistor chip 103. Finally, as shown in FIG. 1D, a bridging copper sheet 105 is disposed on the corresponding solder paste layer 102 and the corresponding solder paste 104, and undergoes a high temperature reflow process of 380 degrees Celsius so that the lead frame 101, the transistor chip 103 and the bridging copper sheet 105 are joined to each other.

The above-mentioned manufacturing process and finished product have at least the three following technical problems:

First, the package structure uses the lead frame and the bridging copper sheet, so the height (also called thickness) of the package cannot be reduced, which limits its application fields.

Second, the solder paste contains a high proportion of lead, and lead metal will cause environmental pollution and have a considerable impact on human health.

Third, in the high temperature reflow process at 380 degrees Celsius, each component may be displaced before all components are fixed, resulting in a decrease in accuracy.

As mentioned above, in response to the aforementioned technical problems, providing a semiconductor package structure and its manufacturing method that can integrate the high-power component and the driver component is indeed one of the current important subject matters.

SUMMARY OF THE INVENTION

In view of the above, an object of the present invention is to provide a semiconductor package structure and a manufacturing method thereof, which can reduce the volume of the semiconductor package structure including the high power component and the driver component, and can also increase the electrical performance. Another object of the present invention is to provide a semiconductor package structure and a manufacturing method thereof, which can meet the requirements of environmental protection laws without using lead-containing manufacturing processes.

To achieve the above objective, the present invention provides a semiconductor package structure, which includes a first dielectric layer, a first patterned conductive layer, an integrated chip, a second power chip, a second patterned conductive layer, a first conductive adhesive part, a second conductive adhesive part, a plurality of first conductive connecting elements, a plurality of second conductive connecting elements, and a build-up circuit structure, wherein the integrated chip includes a control chip and a first power chip.

In one embodiment, the first dielectric layer has a first surface and a second surface disposed opposite to each other. The first patterned conductive layer is disposed on the second surface of the first dielectric layer. The integrated chip is embedded in the first dielectric layer and includes a control chip and a first power chip. The control chip has an active surface and a rear surface, and the rear surface faces the second surface of the first dielectric layer. On the other hand, the first power chip has a first front surface and a first rear surface, wherein the first front surface is provided with a first electrode layout and the first rear surface is provided with a second electrode layout. The second electrode layout of the first power chip is electrically connected and adhered to the first patterned conductive layer through the first conductive adhesive part.

In one embodiment, the second power chip is embedded in the first dielectric layer and has a second front surface and a second rear surface. Among them, the second front surface is provided with a third electrode layout, and the second rear surface is provided with a fourth electrode layout. The fourth electrode layout of the second power chip is electrically connected and adhered to the first patterned conductive layer through the second conductive adhesive part.

In one embodiment, the second patterned conductive layer is disposed on the first surface of the first dielectric layer and electrically connected to the first electrode layout of the first power chip and the third electrode layout of the second power chip through the first conductive connecting elements.

In one embodiment, the second conductive connecting elements are electrically connected between the first patterned conductive layer and the second patterned conductive layer.

In one embodiment, the build-up circuit structure is disposed on the first surface of the first dielectric layer and is electrically connected to the second patterned conductive layer.

In one embodiment, the first power chip is a High-Side MOSFET, and the second power chip is the Low-Side MOSFET.

In one embodiment, the first electrode layout of the first power chip is the same as the third electrode layout of the second power chip and includes a gate and a source respectively. The second electrode layout of the first power chip is the same as the fourth electrode layout of the second power chip and includes a drain.

In one embodiment, the source of the first power chip is electrically connected to the drain of the second power chip through one of the first conductive connecting elements, the second patterned conductive layer, one of the second conductive connecting elements, the first patterned conductive layer and the first conductive adhesive part.

In one embodiment, the control chip is a driver chip, and its active surface is provided with at least one connecting pad, and the second patterned conductive layer is electrically connected to the connecting pad via one of the first conductive connecting elements.

In one embodiment, the first electrode layout of the first power chip is the same as the fourth electrode layout of the second power chip and includes a gate and a source respectively. The second electrode layout of the first power chip is the same as the third electrode layout of the second power chip includes a drain respectively.

In one embodiment, the source of the first power chip is electrically connected to the drain of the second power chip via two of the first conductive connecting elements and the second patterned conductive layer.

In one embodiment, the semiconductor package structure further includes the first protective layer, which is disposed on the second surface of the first dielectric layer and covers the first patterned conductive layer.

In one embodiment, the build-up circuit structure includes at least one second dielectric layer, a plurality of third conductive connecting elements and a third patterned conductive layer. The second dielectric layer has a third surface and a fourth surface oppositely disposed, and the fourth surface is connected to the first surface of the first dielectric layer. The third patterned conductive layer is disposed on the third surface of the second dielectric layer and is electrically connected to the second patterned conductive layer through the third conductive connecting elements.

In one embodiment, the semiconductor package structure further includes a second protective layer. The second protective layer is disposed on the third surface of the second dielectric layer and covers the third patterned conductive layer.

In addition, to achieve the above object, the present invention provides a method for manufacturing the semiconductor package structure, which includes the following steps. The first is to provide a carrier board. The second is to form a first patterned conductive layer on the carrier board. The third is to dispose an integrated chip on the first patterned conductive layer through a first conductive adhesive part. The integrated chip includes a control chip and a first power chip, wherein the first power chip is a High-Side MOSFET. The fourth is to dispose a second power chip on the first patterned conductive layer through a second conductive adhesive part, wherein the second power chip is a Low-Side MOSFET. The fifth is to form a plurality of second conductive connecting elements in the first patterned conductive layer. The sixth is to form a first dielectric layer having a first surface and a second surface opposite to each other to cover the first patterned conductive layer, the first conductive adhesive part, the second conductive adhesive part, the integrated chip, the second power chip and the second conductive connecting elements. Among them, a second surface of the first dielectric layer is temporarily connected to the carrier board. The seventh is to form a plurality of first conductive connecting elements electrically connected to an active surface of the control chip, a first electrode layout of the first power chip, and a third electrode layout of the second power chip. The eighth is to form a second patterned conductive layer on a first surface of the first dielectric layer, and electrically connect to the first conductive connecting elements and the second conductive connecting elements. The ninth is to form a build-up circuit structure on the first surface of the first dielectric layer, and electrically connect to the second patterned conductive layer. The tenth is to remove the carrier board.

In one embodiment, the rear surface of the control chip and the second electrode layout of the first power chip are fixed to the first patterned conductive layer through the first conductive adhesive part, and the fourth electrode layout of the second power chip is fixed to the first patterned conductive layer through the second conductive adhesive part.

In one embodiment, the second conductive connecting elements are formed on a part of the surface of the first patterned conductive layer, which being without the first conductive adhesive part or the second conductive adhesive part.

In one embodiment, the first electrode layout of the first power chip includes a gate and a source, and the fourth electrode layout of the second power chip includes a drain. The source of the first power chip is electrically connected to the drain of the second power chip via one of the first conductive connecting elements, the second patterned conductive layer, one of the second conductive connecting elements, the first patterned conductive layer and the first conductive adhesive part.

In one embodiment, the manufacturing method of the semiconductor package structure further includes the following steps. First, a plurality of first openings are formed on the first dielectric layer to respectively expose the active surface of the control chip, the first electrode layout of the first power chip, and the third electrode layout of the second power chip. Then, the first conductive connecting elements are formed in the first openings.

In one embodiment, the first conductive connecting elements and the second patterned conductive layer are simultaneously formed in the same process.

In one embodiment, the first conductive connecting elements are performed on the active surface of the control chip, the first electrode layout of the first power chip, and the third electrode layout of the second power chip before the step of disposing the integrated chip and the second power chip on the first patterned conductive layer.

In one embodiment, the manufacturing method of the semiconductor package structure further includes forming a first protective layer on the second surface of the first dielectric layer to cover the first patterned conductive layer.

In one embodiment, the step to form the build-up circuit structure includes the following sub-steps. The first is to form a plurality of the third conductive connecting elements in the second patterned conductive layer. Then, a second dielectric layer having a third surface and a fourth surface opposite to each other is formed to cover the third conductive connecting elements and the second patterned conductive layer. The fourth surface of the second dielectric layer is connected to the first surface of the first dielectric layer. Finally, a third patterned conductive layer is formed on the third surface of the second dielectric layer and is electrically connected to the third conductive connecting elements.

In one embodiment, the manufacturing method of the semiconductor package structure further includes forming a second protective layer on the third surface of the second dielectric layer to cover the third patterned conductive layer.

As mentioned above, the semiconductor package structure and its manufacturing method of the present invention integrate the control chip and the first power chip into a single chip to reduce the size of the package structure. Among them, the control chip is, for example, the driver chip, and the first power chip is, for example, a transistor chip. On the other hand, using the semiconductor process to replace the conventional reflow process can also greatly improve the accuracy of the package structure.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

FIGS. 3A to 3M are schematic diagrams of the manufacturing process corresponding to the first manufacturing method of the semiconductor package structure of the first embodiment of the present invention.

FIG. 5B-1 and FIG. 5B-2 are cross-sectional schematic diagrams of the semiconductor package structure connected to the external element in the second aspect of the first embodiment of the present invention.

DESCRIPTION OF THE PREFERRED EMBODIMENT

In the following description, this invention will be explained with reference to embodiments thereof. However, the description of these embodiments is only for purposes of illustration rather than limitation. Hereinafter, the semiconductor package structure and the method for manufacturing the semiconductor package structure of the preferred embodiment of the present invention will be described with reference to related drawings.

Figure 1A:
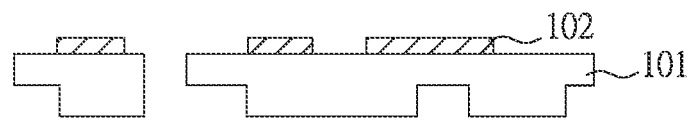
FIGS. 1A to 1D are schematic diagrams showing the manufacturing method of bonding transistors using cooper clip technology in the package structure of the prior art.
Figure 1B:
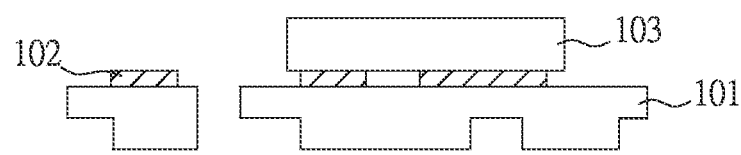
Figure 1C:
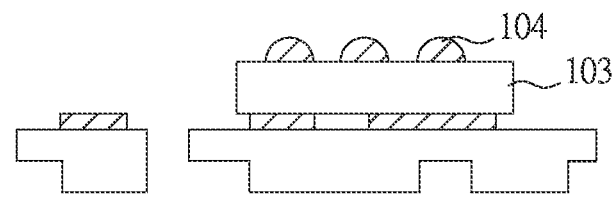
Figure 1D:
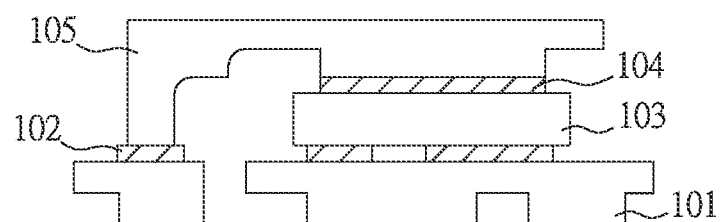
Figure 2A:
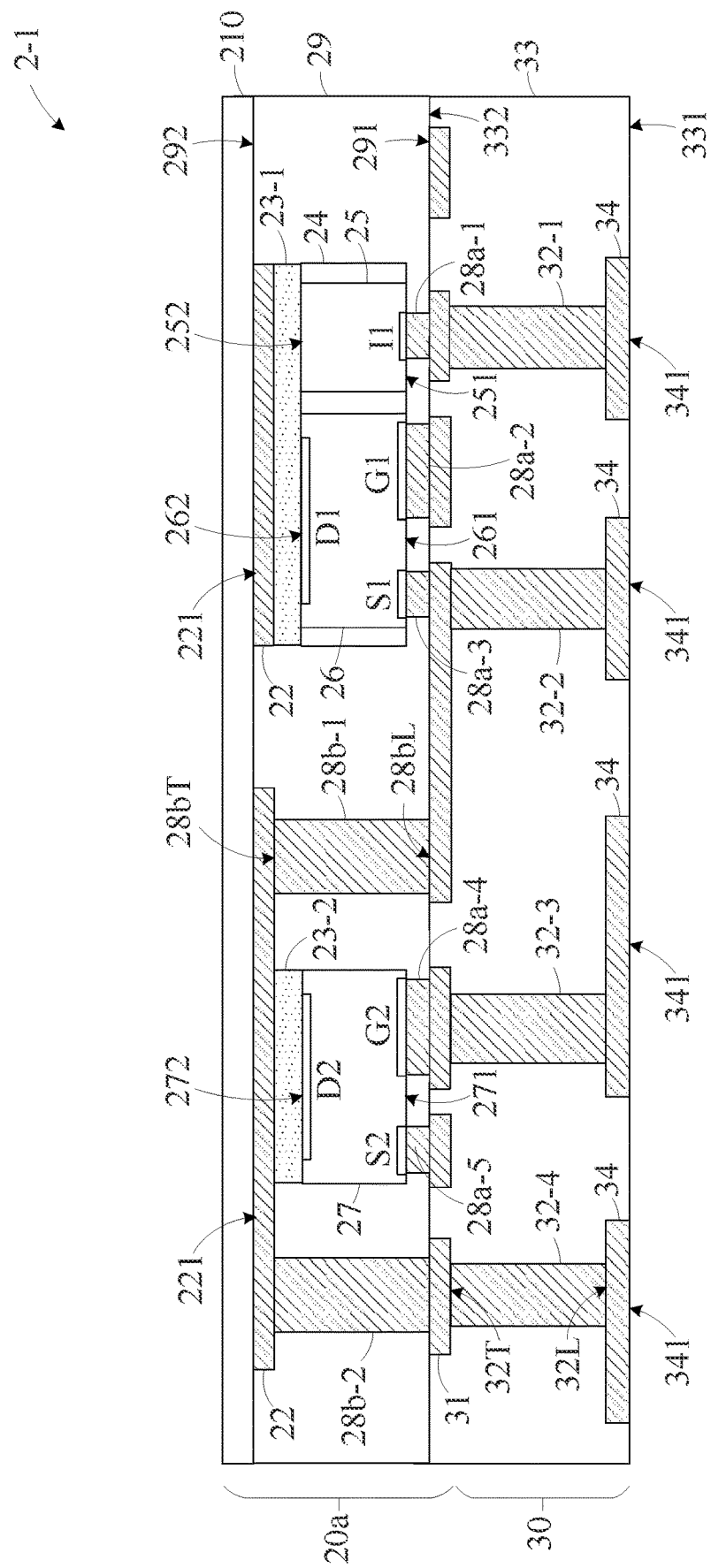
FIG. 2A is a schematic cross-sectional view of the semiconductor package structure according to the first type of the first embodiment of the present invention.

FIG. 2A is a schematic cross-sectional view of the semiconductor package structure 2-1 according to the first implementation of the first embodiment of the present invention. As shown in FIG. 2A, the semiconductor package structure 2-1 of the first implementation includes a first build-up circuit structure 20a and a second build-up circuit structure 30, wherein the first build-up circuit structure 20a is stacked on the second build-up circuit structure 30.

The first build-up circuit structure 20a includes a first dielectric layer 29, a first patterned conductive layer 22, a first conductive adhesive part 23-1, a second conductive adhesive part 23-2, an integrated chip 24, a second power chip 27, a plurality of first conductive connecting elements 28a-1, 28a-2, 28a-3, 28a-4, 28a-5, a plurality of second conductive connecting elements 28b-1, 28b-2, a second patterned conductive layer 31 and a first protective layer 210.

On the other hand, the second build-up circuit structure 30 includes a second dielectric layer 33, a plurality of third conductive connecting elements 32-1, 32-2, 32-3, 32-4, and a third patterned conductive layer 34.

In the first build-up circuit structure 20a, the first dielectric layer 29 has a first surface 291 and a second surface 292 arranged opposite to each other. The material of the first dielectric layer 29 can be a high filler content dielectric material, such as a molding compound, which uses novolac-based resin, epoxy-based resin or silicone-based resin as the main matrix, and accounts for approximately about 8 wt. % to 12 wt. %, and doped with a filler that accounts for about 70 wt. % to 90 wt. % of the total. Among them, the filler may include silica and alumina to increase mechanical strength, reduce linear thermal expansion coefficient, increase heat conduction, increase water resistance and reduce glue overflow.

The first patterned conductive layer 22 is disposed on the second surface 292 of the first dielectric layer 29. In detail, the first patterned conductive layer 22 is embedded in the first dielectric layer 29, and a surface 221 of the first patterned conductive layer 22 is exposed to the second surface 292 of the first dielectric layer 29. The first patterned conductive layer 22 has a preset circuit layout, and its material is, for example, copper.

The integrated chip 24 is embedded in the first dielectric layer 29, and the first conductive adhesive part 23-1 is disposed between the integrated chip 24 and the first patterned conductive layer 22. Therefore, the integrated chip 24 is fixedly arranged on the first patterned conductive layer 22 by the first conductive adhesive part 23-1. The integrated chip 24 includes a control chip 25 and a first power chip 26. In other words, the present invention integrates the control chip 25 and the first power chip 26 into a single integrated chip 24 to reduce the volume of the semiconductor package structure 2-1.

The control chip 25 has an active surface 251 and a rear surface 252 opposite to each other. The control chip 25 is disposed with the rear surface 252 facing the second surface 292 of the first dielectric layer 29, and the rear surface 252 is connected to the first patterned conductive layer 22 through the first conductive adhesive part 23-1. The control chip 25 may be, for example, a driver IC, which is used to drive the first power chip 26 and the second power chip 27. In the embodiment, the active surface 251 of the control chip 25 is provided with at least one connecting pad, which is, for example, an input pad I1, while the rear surface 252 of the control chip 25 does not have the connecting pad. There is a conductive element (not shown in the figure) in the integrated chip 24 to electrically connect the control chip 25 to the first power chip 26 to transmit a driving signal generated by the control chip 25 to the first power chip 26.

The first power chip 26 has a first front surface 261 and a first rear surface 262 opposite to each other. The first power chip 26 is disposed with the first rear surface 262 facing the second surface 292 of the first dielectric layer 29, and the first rear surface 262 is connected to the first patterned conductive layer 22 through the first conductive adhesive part 23-1. In addition, the first power chip 26 has a first electrode layout and a second electrode layout, which are respectively disposed on the first front surface 261 and the first rear surface 262. In the embodiment, the active surface 251 of the control chip 25 and the first front surface 261 of the first power chip 26 are substantially the same surface, and the rear surface 252 of the control chip 25 and the first rear surface 262 of the first power chip 26 are substantially the same surface. In other embodiments, it may have different structural combinations depending on its design.

In the embodiment, the first power chip 26 may be a High-Side MOSFET, such as a Metal-Oxide-Semiconductor Field-Effect Transistor (MOSFET). Therefore, the first electrode layout of the first power chip 26 may include a gate G1 and a source S1, and the second electrode layout may include a drain D1. In other embodiments, the first power chip 26 may also be a bipolar junction transistor (BJT) chip or the insulated gate bipolar transistor (IGBT) chip. From the above, the second electrode layout (including the drain D1) of the first rear surface 262 of the first power chip 26 is electrically connected to the first patterned conductive layer 22 through the first conductive adhesive part 23-1.

The first conductive adhesive part 23-1 may be, for example, a conductive adhesive made of a highly heat-dissipating conductive material, such as silver or copper, which not only provides the function of fixing the integrated chip 24 and the first patterned conductive layer 22, but also provides the electrical conduction path between the second electrode layout (including drain D1) of the first power chip 26 and the first patterned conductive layer 22.

Similar to the arrangement of the integrated chip 24, the second power chip 27 is also embedded in the first dielectric layer 29, and fixedly disposed on the first patterned conductive layer 22 by the second conductive adhesive part 23-2. However, the difference from the integrated chip 24 is that the second power chip 27 is a single chip, which does not integrate other control chip or components.

The second power chip 27 also has a second front surface 271 and a second rear surface 272 that are relatively arranged. The second power chip 27 is disposed with the second rear surface 272 facing the second surface 292 of the first dielectric layer 29, and the second rear surface 272 is connected to the first patterned conductive layer 22 via the second conductive adhesive part 23-2. In addition, the second power chip 27 has a third electrode layout and a fourth electrode layout, which are respectively disposed on the second front surface 271 and the second rear surface 272.

Similar to the first power chip 26, the second power chip 27 may also be the Low-Side MOSFET, for example, Metal-Oxide-Semiconductor Field-Effect Transistor (MOSFET). Therefore, the third electrode layout of the second power chip 27 may include a gate G2 and a source S2, and the fourth electrode layout of the second power chip 27 may include a drain D2. In other embodiments, the second power chip 27 may also be a BJT chip or a IGBT chip. The fourth electrode layout (including drain D2) of the second rear surface 272 of the second power chip 27 is electrically connected to the first patterned conductive layer 22 through the second conductive adhesive part 23-2 with the highly heat-dissipating conductive material.

The first conductive connecting elements 28a-1, 28a-2, 28a-3, 28a-4, 28a-5 are embedded in the first dielectric layer 29, and are respectively disposed between the first surface 291 of the first dielectric layer 29 and the active surface 251 of the control chip 25, the first front surface 261 of the first power chip 26, or the second front surface 271 of the second power chip 27. Among them, the first conductive connecting element 28a-1 is electrically connected to the input pad I1 of the control chip 25, the first conductive connecting elements 28a-2 and 28a-3 are electrically connected to gate G1 and source S1 of the first power chip 26, respectively and the first conductive connecting elements 28a-4 and 28a-5 are electrically connected to gate G2 and source S2 of the second power chip 27, respectively.

In addition, the second conductive connecting elements 28b-1 and 28b-2 are also embedded in the first dielectric layer 29 and disposed on both sides of the second power chip 27. One end surface 28bT of the second conductive connecting elements 28b-1, 28b-2 are electrically connected to the first patterned conductive layer 22, and the other end surface 28bL is exposed to the first surface 291 of the first dielectric layer 29. It should be noted that in the first embodiment, the second conductive connecting element 28b-1 is used as the electrical conduction path between the source S1 of the first power chip 26 and the drain D2 of the second power chip 27. In addition to the electrical conduction function, the second conductive connecting elements 28b-1 and 28b-2 also have the function of supporting structural strength to support the first build-up circuit structure 20a.

The first conductive connecting elements 28a-1, 28a-2, 28a-3, 28a-4, 28a-5 and the second conductive connecting elements 28b-1, 28b-2 mentioned above may be conductive pillars, for example, copper pillars, copper alloy pillars, or other conductive metal pillars formed through electroplating, filling, or lithography processes.

The second patterned conductive layer 31 is disposed on the first surface 291 of the first dielectric layer 29 (the second patterned conductive layer 31 is not embedded in the first dielectric layer 29, but embedded in the second dielectric layer 33), and electrically connected to the active surface 251 of the control chip 25, the first electrode layout of the first front surface 261 of the first power chip 26 and the third electrode layout of the second front surface 271 of the second power chip 27 via the first conductive connecting elements 28a-1, 28a-2, 28a-3, 28a-4, 28a-5. In other words, the second patterned conductive layer 31 is electrically connected to the input pad I1 of the control chip 25, the gate G1 and source S1 of the first power chip 26 and the gate G2 and source S2 of the second power chip 27 through the first conductive connecting elements 28a-1, 28a-2, 28a-3, 28a-4, and 28a-5. In addition, the second patterned conductive layer 31 is also electrically connected to the first patterned conductive layer 22 through the second conductive connecting elements 28b-1 and 28b-2. Similar to the first patterned conductive layer 22, the second patterned conductive layer 31 also has a predetermined circuit layout pattern, and its material is, for example, copper.

It should be noted that in other embodiments, the second patterned conductive layer 31 can also be defined as a component of the second build-up circuit structure 30. Under the structure, the first build-up circuit structure 20a does not include the second patterned conductive layer 31.

The uppermost layer of the first build-up circuit structure 20a also has the first protective layer 210, which is disposed on the second surface 292 of the first dielectric layer 29 and covers a surface 221 of the first patterned conductive layer 22. Among them, the material of the first protective layer 210 can be insulating and anti-oxidation materials.

In the second build-up circuit structure 30, the second dielectric layer 33 has a third surface 331 and a fourth surface 332 opposite to each other, and the fourth surface 332 is connected to the first surface 291 of the first dielectric layer 29. In other words, the second dielectric layer 33 is disposed under the first dielectric layer 29, and the fourth surface 332 of the second dielectric layer 33 and the first surface 291 of the first dielectric layer 29 are substantially the same surface (or the same plane). The material of the second dielectric layer 33 is the same as the first dielectric layer 29, and it can also be a dielectric material with a high filler content, such as a mold compound.

The third patterned conductive layer 34 is disposed on the third surface 331 of the second dielectric layer 33 (the third patterned conductive layer 34 is embedded in the second dielectric layer 33), and a surface 341 of the third patterned conductive layer 34 is exposed to the third surface 331 of the second dielectric layer 33. Therefore, the third patterned conductive layer 34 can be used as an electrode pad to be further electrically connected to other external devices or the external element (for detailed implementation, please refer to FIG. 5A-1 and related descriptions).

Continuing to refer to FIG. 2A, the third conductive connecting elements 32-1, 32-2, 32-3, and 32-4 are also embedded in the second dielectric layer 33. One end surface 32T of the third conductive connecting elements 32-1, 32-2, 32-3, 32-4 is connected to the second patterned conductive layer 31, and the other end surface 32L is connected to the third patterned conductive layer 34. The electrical signals from the input pad I1 of the control chip 25, the gate G1 and the source S1 of the first power chip 26, the gate G2 and the source S2 of the second power chip 27 can be electrically conducted to the third patterned conductive layer 34 by the third conductive connecting elements 32-1, 32-2, 32-3, 32-4, and further electrically conducted to other external elements. In addition to the electrical conduction function, the third conductive connecting elements 32-1, 32-2, 32-3, and 32-4 also have the function of supporting structural strength to support the second build-up circuit structure 30. The third conductive connecting elements 32-1, 32-2, 32-3, and 32-4 may also be, for example, copper pillars, copper alloy pillars, or conductive pillars made of other conductive metal materials.

Figure 2B:
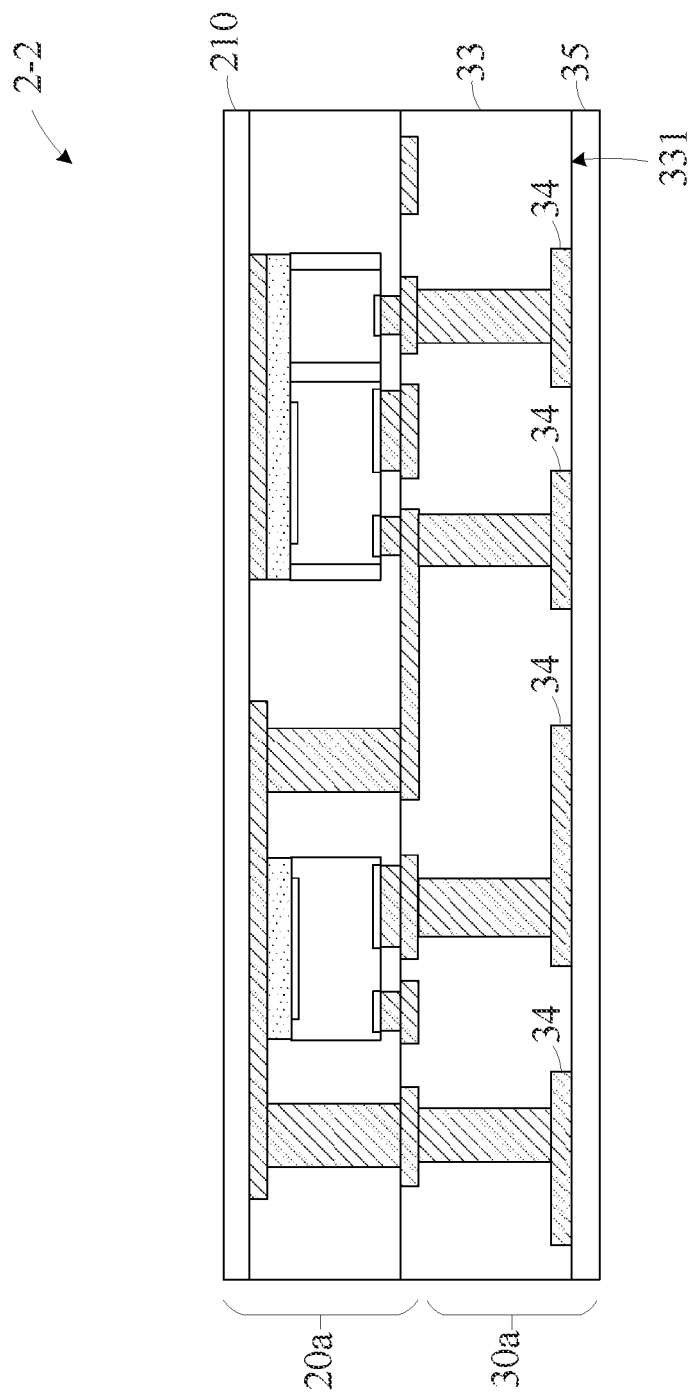
FIG. 2B is a schematic cross-sectional view of the semiconductor package structure according to the second type of the first embodiment of the present invention.

FIG. 2B is a schematic cross-sectional view of the semiconductor package structure 2-2 according to the second aspect of the first embodiment of the present invention. As shown in FIG. 2B, the bottom layer of the second build-up circuit structure 30a of the semiconductor package structure 2-2 of the second aspect further has a second protective layer 35 (the difference from the foregoing is that there is no protective layer under the second build-up circuit structure 30 in the first aspect). The second protective layer 35 is disposed under the second dielectric layer 33 that covers the third surface 331 of the second dielectric layer 33 and the third patterned conductive layer 34. The material of the second protective layer 35 is the same as or similar to the material of the first protective layer 210 of the first build-up circuit structure 20a, and it can also be selected from an insulating material and an anti-oxidation material.

Please refer to FIG. 2A, FIG. 2B, and FIG. 3A to FIG. 3M. The first manufacturing method of the semiconductor package structure 2-1 of the first aspect includes steps S01 to S16. In addition, the manufacturing method of the semiconductor package structure 2-2 of the second aspect further includes step S17.

Figure 3A:
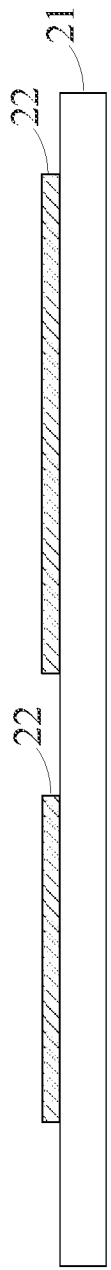

As shown in FIG. 3A, step S01 is to provide a carrier board 21, which can be a metal plate or an insulating plate. It should be noted that the present invention adopts a panel level type packaging process, in which the area of the carrier board 21 is multiple times the area of a single wafer. Accordingly, the carrier board 21 with large size of the present invention can simultaneously perform the packaging process for all chips (or dies) cut from a plurality of wafers, which can effectively save manufacturing time.

Then, step S02 is to form a first patterned conductive layer 22 on the carrier board 21. In the embodiment, the material of the first patterned conductive layer 22 is, for example, copper, which can be completed by lithography technique or metal plating technique.

Figure 3B:
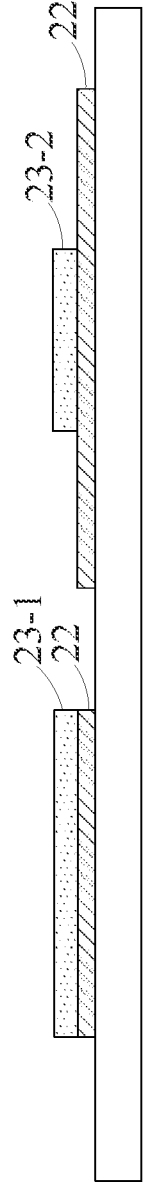

As shown in FIG. 3B, step S03 is to dispose or form a first conductive adhesive part 23-1 and a second conductive adhesive part 23-2 on the first patterned conductive layer 22.

Figure 3C:
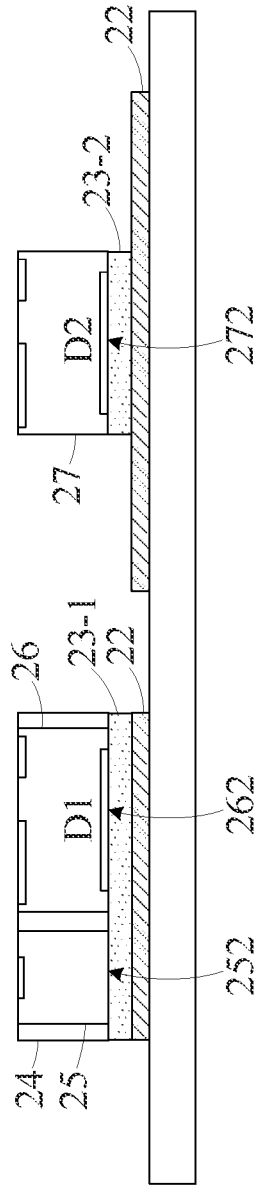

As shown in FIG. 3C, in step S04, an integrated chip 24 is disposed on the first patterned conductive layer 22 through the first conductive adhesive part 23-1, and a second power chip 27 is disposed on the first patterned conductive layer 22 through the second conductive adhesive part 23-2.

In the embodiment, the rear surface 252 of the control chip 25, the second electrode layout (including drain D1) of the first rear surface 262 of the first power chip 26 is fixed to the first conductive adhesive part 23-1, and the fourth electrode layout (including drain D2) of the second rear surface 272 of the second power chip 27 is fixed to the second conductive adhesive part 23-2.

Figure 3D:
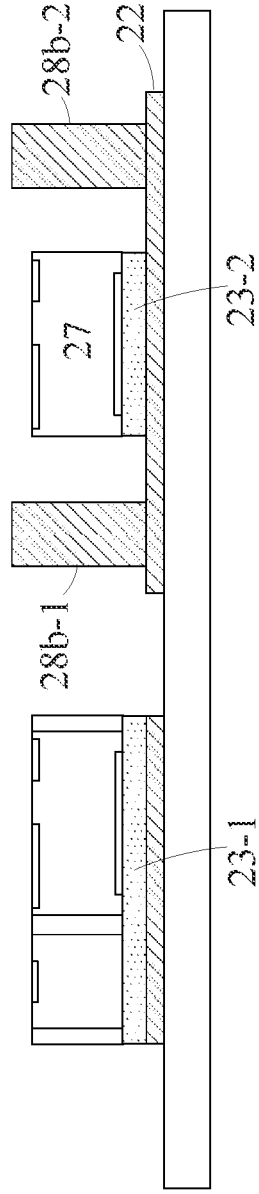

As shown in FIG. 3D, step S05 is to form a second conductive connecting elements 28b-1 and 28b-2 on a part of the surface of the first patterned conductive layer 22 (not provided with the first conductive adhesive part 23-1 or the second conductive adhesive part 23-2). The second conductive connecting elements 28b-1 and 28b-2 are disposed on both sides of the second power chip 27. In the embodiment, the material of the second conductive connecting elements 28b-1, 28b-2 is, for example, copper, which can be formed by lithography technique or metal plating technique. In other embodiments, the second conductive connecting elements 28b-1, 28b-2 can also be pre-shaped by electroless plating technique, and then disposed on the first patterned conductive layer 22 through a conductive adhesive layer (not shown in the figure).

Figure 3E:
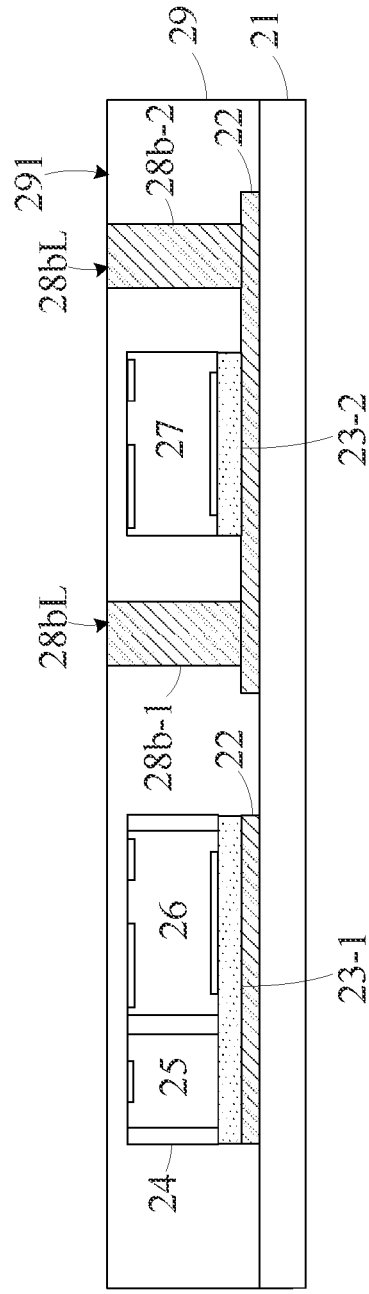

As shown in FIG. 3E, step S06 is to form a first dielectric layer 29 on the carrier board 21, and to cover the first patterned conductive layer 22, the first conductive adhesive part 23-1, the second conductive adhesive part 23-2, the integrated chip 24 (including the control chip 25 and the first power chip 26), the second power chip 27 and the second conductive connecting elements 28b-1, 28b-2. After the first dielectric layer 29 is formed, the end surface 28bL of the second conductive connecting elements 28b-1 and 28b-2 can be exposed to the first surface 291 of the first dielectric layer 29 through a polishing process.

As shown in FIG. 3F, step S07 is to form a plurality of first openings 29o-1, 29o-2, 29o-3, 29o-4, 29o-5 on the first dielectric layer 29 to expose the active surface 251 of the control chip 25 (including the input pad I1), the first electrode layout (including gate G1 and source S1) of the first power chip 26, and the third electrode layout (including gate G2 and source S2) of the second power chip 27. Among them, the first openings 29o-1, 29o-2, 29o-3, 29o-4, 29o-5 can be formed by laser drilling technique or can be formed by lithography technique.

As shown in FIG. 3G, step S08 is to form a plurality of first conductive connecting elements 28a-1, 28a-2, 28a-3, 28a-4 and 28a-5 in the first openings 29o-1, 29o-2, 29o-3, 29o-4 and 29o-5 in FIG. 3F, respectively. The first conductive connecting elements 28a-1, 28a-2, 28a-3, 28a-4 and 28a-5 respectively extend downward and are connected to the input pad I1 of the control chip 25, the gate G1 and source S1 of the first power chip 26, and the gate G2 and source S2 of the second power chip 27. The first conductive connecting elements 28a-1, 28a-2, 28a-3, 28a-4, 28a-5 are made of copper, for example, which can be completed by lithography technique or metal plating technique.

Next, in step S09, a second patterned conductive layer 31 is formed on the first surface 291 of the first dielectric layer 29, and the second patterned conductive layer 31 is electrically connected to the first conductive connecting elements 28a-1, 28a-2, 28a-3, 28a-4 and 28a-5 and the second conductive connecting elements 28b-1 and 28b-2. Similar to the first patterned conductive layer 22, the second patterned conductive layer 31 is made of copper, for example, which can be formed by lithography technique or metal plating technique.

In other embodiments, the first conductive connecting elements 28a-1, 28a-2, 28a-3, 28a-4 and 28a-5 and the second patterned conductive layer 31 can be formed at the same time in the same process. While forming the second patterned conductive layer 31, the conductive material can also be filled down in the first openings 29o-1, 29o-2, 29o-3, 29o-4 and 29o-5 in FIG. 3F. to form the first conductive connecting elements 28a-1, 28a-2, 28a-3, 28a-4 and 28a-5, which can save process time. Up to this step, the first build-up circuit structure 20 is formed on the carrier board 21.

Figure 3H:
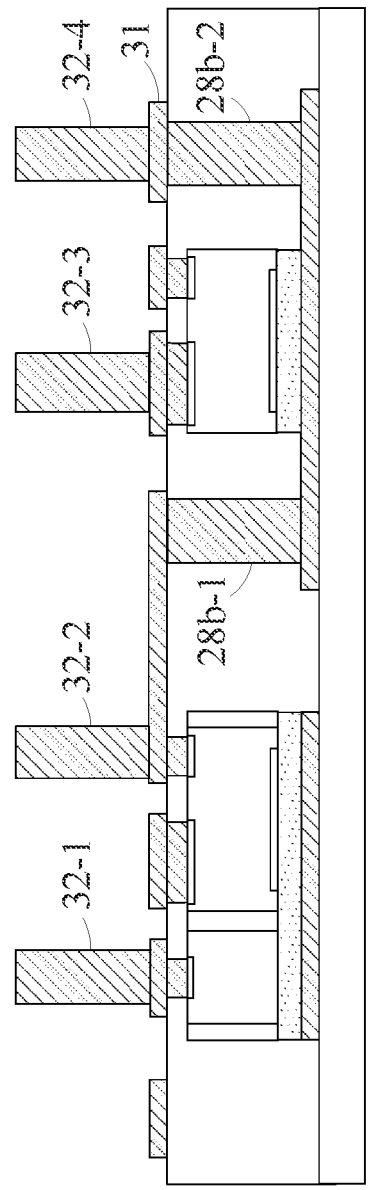

Then, as shown in FIG. 3H, step S10 is to form a third conductive connecting elements 32-1, 32-2, 32-3 and 32-4 on the second patterned conductive layer 31. Similar to the second conductive connecting elements 28b-1 and 28b-2, the material of the third conductive connecting elements 32-1, 32-2, 32-3 and 32-4 is, for example, copper, which can be formed by lithography technique or metal plating technique. In other embodiments, the third conductive connecting elements 32-1, 32-2, 32-3 and 32-4 can also be pre-shaped by electroless plating and then pass through the conductive adhesive layer (not shown in the figure) to dispose on the second patterned conductive layer 31.

Figure 3I:
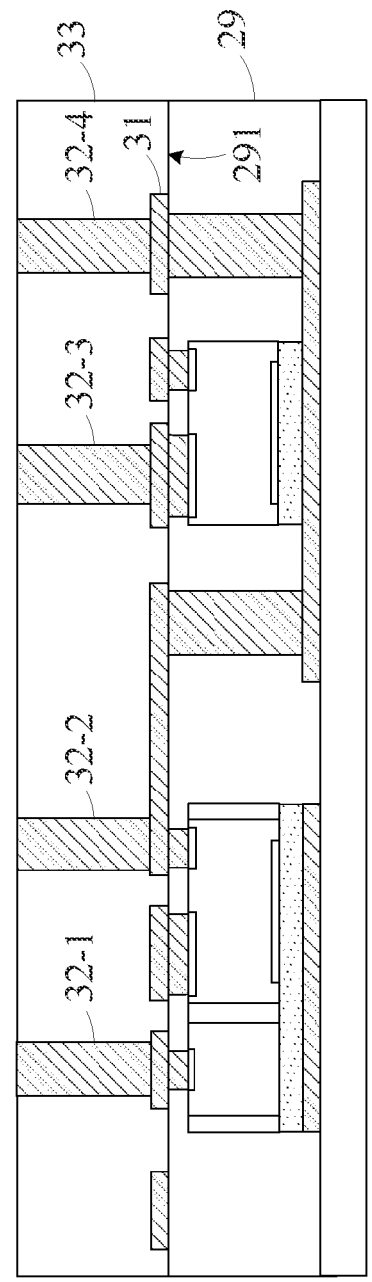

As shown in FIG. 3I, step S11 is to form a second dielectric layer 33 on the first surface 291 of the first dielectric layer 29 to cover the second patterned conductive layer 31 and the third conductive connecting elements 32-1, 32-2, 32-3 and 32-4.

Figure 3J:
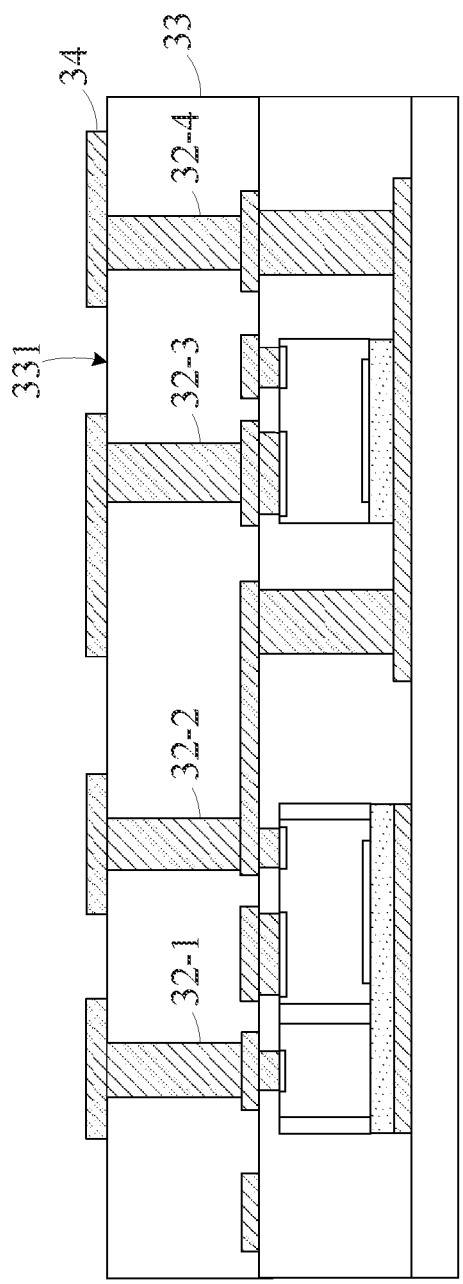

As shown in FIG. 3J, step S12 is to form a third patterned conductive layer 34 on the third surface 331 of the second dielectric layer 33, and the third patterned conductive layer 34 is electrically connected to the third conductive connecting elements 32-1, 32-2, 32-3, and 32-4.

Figure 3K:
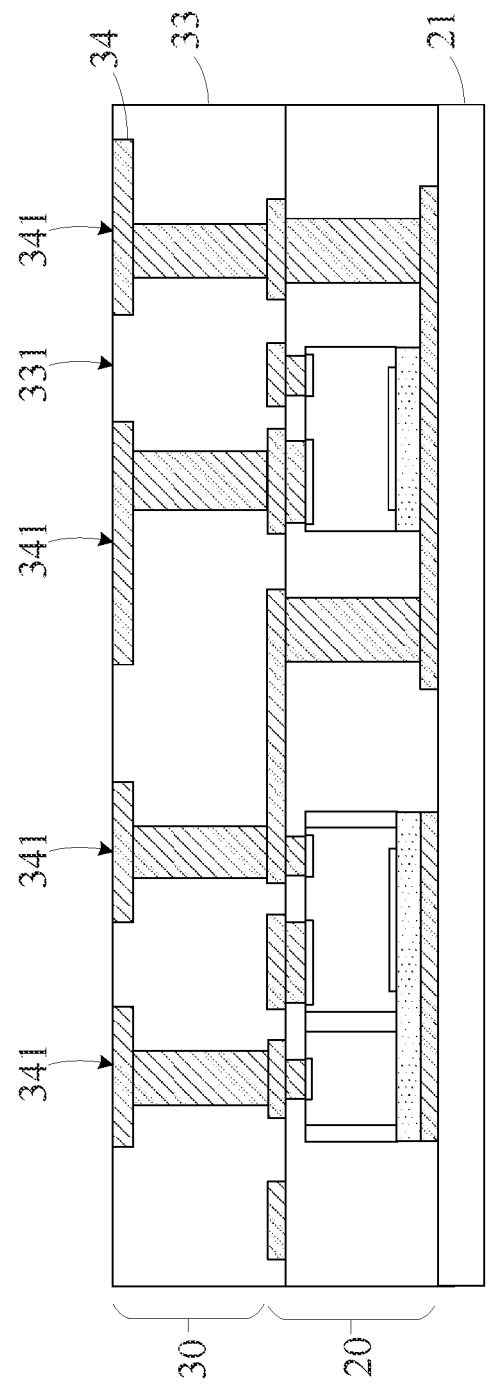

As shown in FIG. 3K, step S13 is to perform the molding process again to increase the height of the second dielectric layer 33 upward. The third surface 331 of the second dielectric layer 33 after being molded again is flush with the surface 341 of the third patterned conductive layer 34. Up to this step, the second build-up circuit structure 30 is formed on the first build-up circuit structure 20. Next, step S14 is to remove the carrier board 21 to expose a second surface 292 of the first dielectric layer 29.

As shown in FIG. 3L, step S15 is to form a first protective layer 210 on the second surface 292 of the first dielectric layer 29 after the carrier board 21 is removed. The first protective layer 210 covers the first patterned conductive layer 22 to form a first build-up circuit structure 20a, which is different from the first build-up circuit structure 20 shown in FIG. 3K.

As shown in FIG. 3M, step S16 is to flip the first build-up circuit structure 20a and the second build-up circuit structure 30 in a vertical direction to form the semiconductor package structure 2-1 as shown in FIG. 2A.

In addition, after step S16, step S17 can be optionally performed to form the semiconductor package structure 2-2 shown as FIG. 2B. Please refer to FIG. 2B, step S17 is to form the second protective layer 35 on the third surface 331 of the second dielectric layer 33, which covers the third patterned conductive layer 34, and forms the second build-up circuit structure 30a, which is different from the second build-up circuit structure 30 shown in FIG. 2A, that is, there is no protective layer under the second build-up circuit structure 30.

Figure 4A:
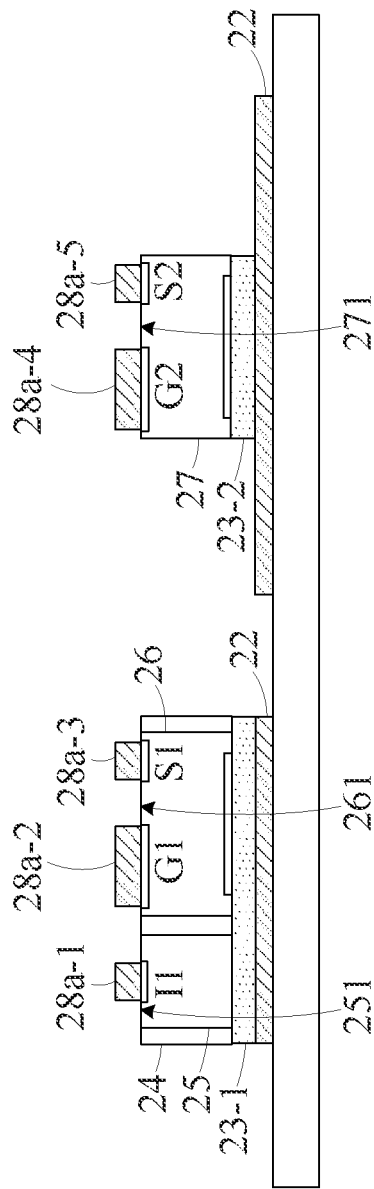
FIGS. 4A to 4C are schematic diagrams of part of the manufacturing process corresponding to the second manufacturing method of the semiconductor package structure of the first embodiment of the present invention.
Figure 4B:
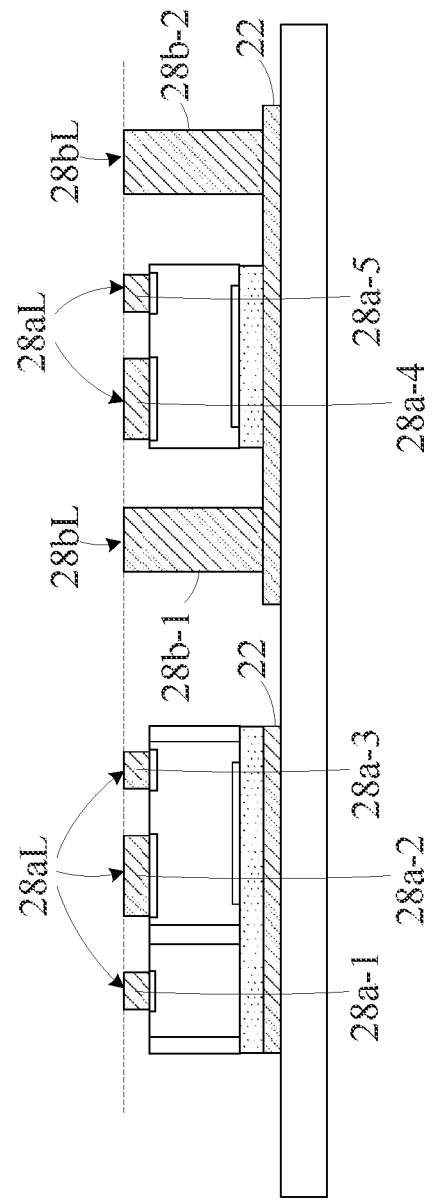
Figure 4C:
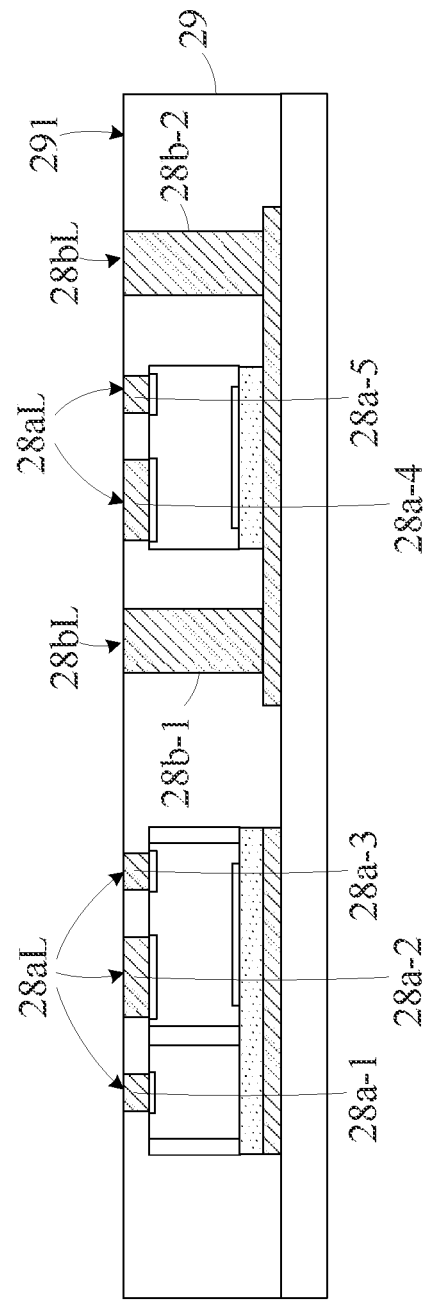

Next, referring to FIGS. 4A to 4C, the second manufacturing method of the semiconductor package structure 2-1 is briefly described, which includes steps S21 to S35. In addition, the second manufacturing method of the semiconductor package structure 2-2 of the second aspect further includes step S36.

Firstly, the steps S21 to S24 are the same as the steps S01 to S04 of the first manufacturing method, so the description will not be repeated.

Next, referring to FIG. 4A, step S25 is to pre-shape or dispose the first conductive connecting elements 28a-1 on the active surface 251 of the control chip 25, to pre-shape or dispose the first conductive connecting elements 28a-2 and 28a-3 on the first electrode layout of the first front surface 261 of the first power chip 26 and to pre-shape or dispose the first conductive connecting elements 28a-4 and 28a-5 on the third electrode layout of the second front surface 271 of the second power chip 27. Among them, the first conductive connecting element 28a-1 is electrically connected to the input pad I1 of the control chip 25, the first conductive connecting elements 28a-2 and 28a-3 are electrically connected to gate G1 and source S1 of the first power chip 26, respectively, and the first conductive connecting elements 28a-4 and 28a-5 are electrically connected to gate G2 and source S2 of the second power chip 27, respectively.

After the integrated chip 24 and the second power chip 27 are fixedly connected to the first conductive adhesive part 23-1 and the second conductive adhesive part 23-2, step S25 can be performed and the first conductive connecting elements 28a-1, 28a-2, 28a-3, 28a-4 and 28a-5 are formed on the active surface 251 of the control chip 25, the first front surface 261 of the first power chip 26, and the second front surface 271 of the second power chip 27. In the embodiment, the first conductive connecting elements 28a-1, 28a-2, 28a-3, 28a-4 and 28a-5 are formed by lithography technique or metal plating technique.

In another embodiment, before the integrated chip 24 and the second power chip 27 are fixedly connected to the first conductive adhesive part 23-1 and the second conductive adhesive part 23-2, the first conductive connecting elements 28a-1, 28a-2, 28a-3, 28a-4 and 28a-5 are pre-formed on the input pad I1 of the control chip 25, the gate G1 and source S1 of the first power chip 26 and the gate G2 and source S2 of the second power chip 27. In the embodiment, the first conductive connecting elements 28a-1, 28a-2, 28a-3, 28a-4 and 28a-5 are pre-shaped conductive bumps, respectively.

Then, as shown in FIG. 4B, step S26 is to form the second conductive connecting elements 28b-1 and 28b-2 on the first patterned conductive layer 22, and make the end surface 28bL of the second conductive connecting elements 28b-1 and 28b-2 is substantially flush with the end surface 28aL of the first conductive connecting elements 28a-1, 28a-2, 28a-3, 28a-4 and 28a-5. The remaining details of step S26 are the same as step S05 of the first manufacturing method, so the description will not be repeated.

Then, as shown in FIG. 4C, step S27 is to form the first dielectric layer 29, and make the end surface 28bL of the second conductive connecting elements 28b-1 and 28b-2 and the end surface 28aL of the first conductive connecting elements 28a-1, 28a-2, 28a-3, 28a-4 and 28a-5 to expose to the first surface 291 of the first dielectric layer 29 through a polishing process.

Then, the subsequent steps S28 to S35 are performed to finally form the semiconductor package structure 2-1 as shown in FIG. 2A. The steps S28 to S35 are the same as the steps S09 to S16 of the first manufacturing method, so the description will not be repeated.

In addition, step S36 (the same as step S17 of the first manufacturing method) can be optionally performed to form the second protective layer 35 on the third surface 331 of the second dielectric layer 33, and finally form the semiconductor package structure 2-2 shown as FIG. 2B.

In the present invention, the two aspects of the semiconductor package structure 2-1 and 2-2 of the first embodiment can be further electrically connected to other the external elements. For example, please refer to FIG. 5A-1, in the semiconductor package structure 2-1 of the first aspect, since the third patterned conductive layer 34 can be used as an electrode pad, it can be further formed the conductive element 36 on the exposed surface 341, and the semiconductor package structure 2-1 is electrically connected to a circuit board 37 through the conductive element 36. Among them, the circuit board 37 may be a printed circuit board, a metal core circuit board, or a glass circuit board.

Figures 1, 5A:
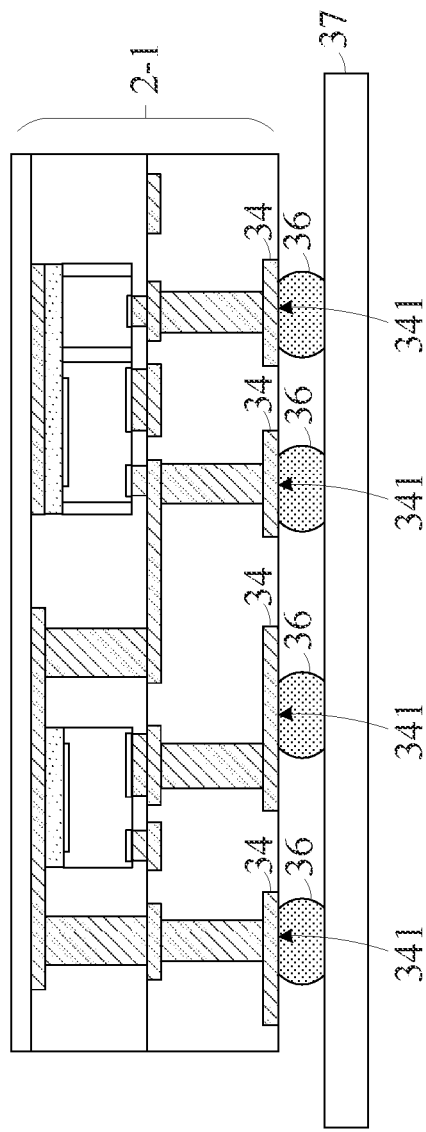
FIG. 5A-1 and FIG. 5A-2 are cross-sectional schematic diagrams of the semiconductor package structure connected to the external element in the first aspect of the first embodiment of the present invention.
Figures 2, 5A:
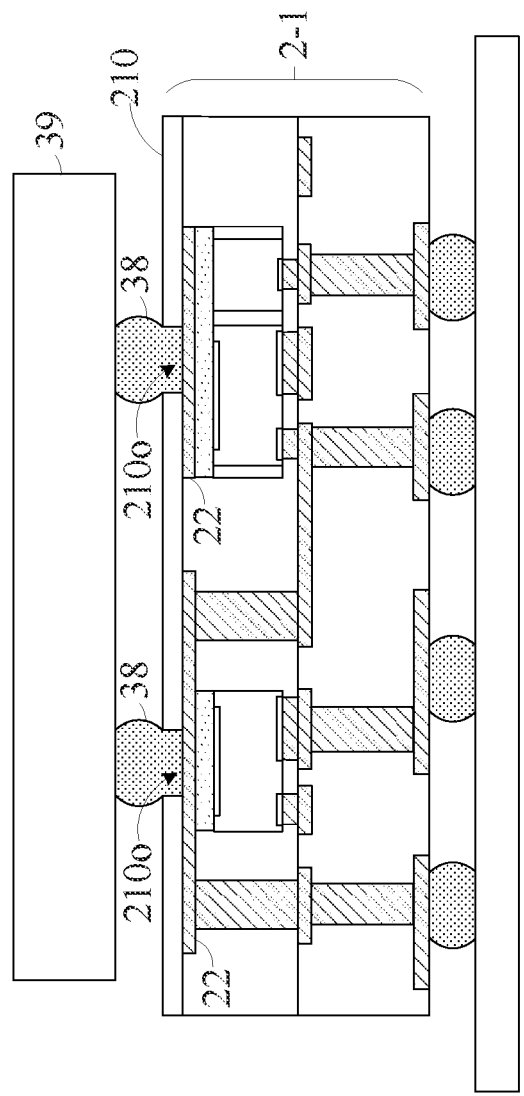

In addition, as shown in FIG. 5A-2, a plurality of the second opening 210o can be formed on the first protective layer 210 of the semiconductor package structure 2-1, which exposes part of the first patterned conductive layer 22, and the conductive element 38 is formed on the corresponding positions of the second opening 210o, respectively. An external element 39 can be electrically connected to the semiconductor package structure 2-1 through the conductive element 38.

Figures 1, 5B:
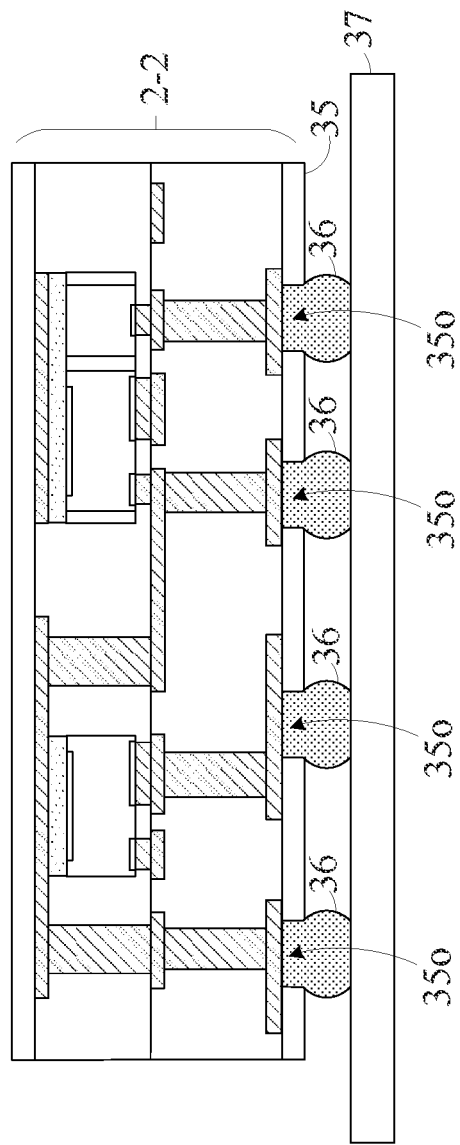
Figures 2, 5B:
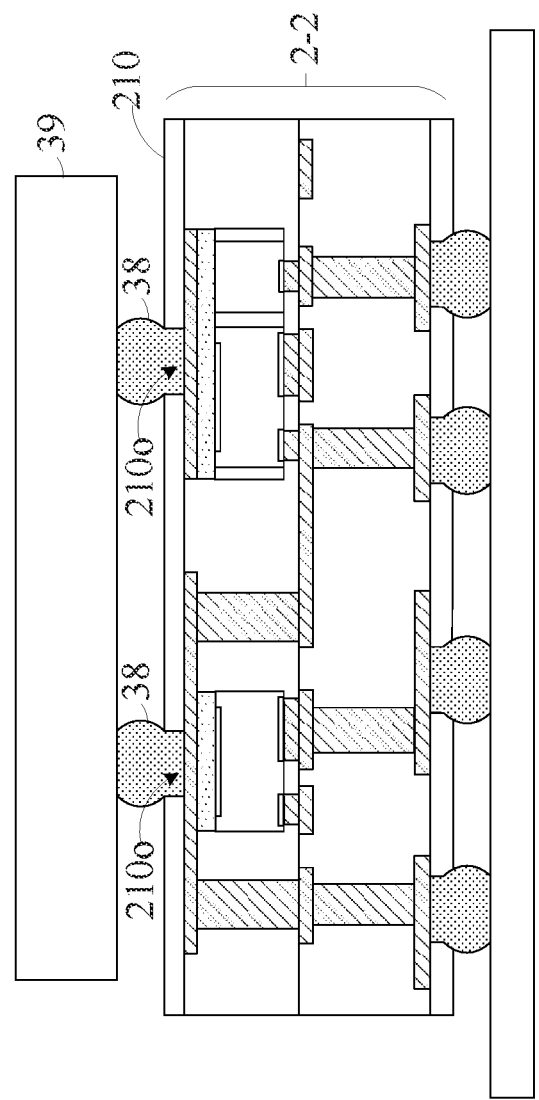

In addition, please refer to FIG. 5B-1, in the semiconductor package structure 2-2 of the second aspect, there are a plurality of the third openings 35o formed on the second protective layer 35, and the conductive element 36 is formed on the corresponding position to dispose the semiconductor package structure 2-2 on the circuit board 37 through the conductive element 36.

Similarly, as shown in FIG. 5B-2, the first protective layer 210 of the semiconductor package structure 2-2 of the second aspect can also be formed with a plurality of the second opening 210o and correspondingly disposed the conductive element 38 to dispose the external element 39 on the semiconductor package structure 2-2 through the conductive element 38.

In addition to the semiconductor package structure 2-1 and 2-2 of the two aspects of the aforementioned first embodiment, the present invention also discloses other different package structure. Please refer to FIGS. 6 and 7 and the description below.

Figure 6:
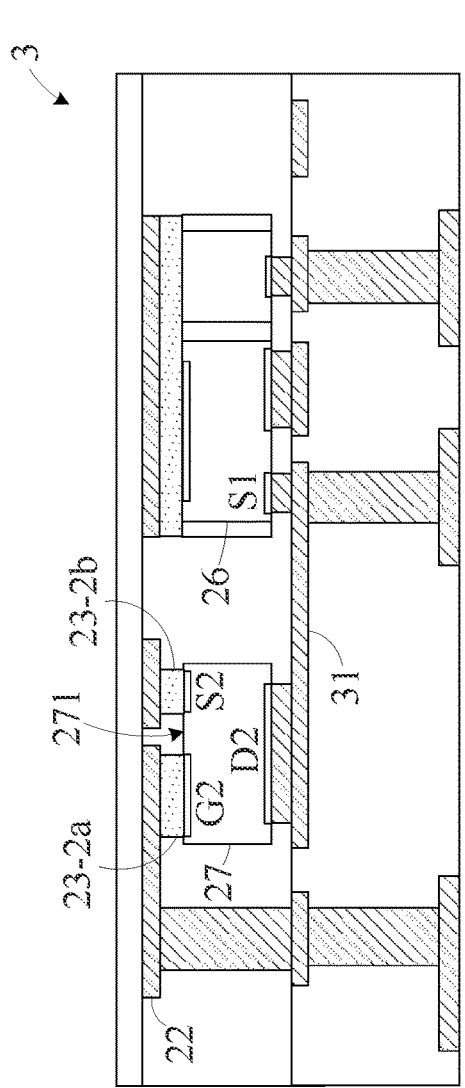
FIG. 6 is a schematic cross-sectional view of the semiconductor package structure according to the second embodiment of the present invention.

FIG. 6 is a schematic cross-sectional view of the semiconductor package structure 3 according to the second embodiment of the present invention. As shown in FIG. 6, compared with the semiconductor package structure 2-1 of the first embodiment, the main difference of the semiconductor package structure 3 of the second embodiment is that the second power chip 27 is reversely arranged in the vertical direction. In other words, the second front surface 271 of the second power chip 27 is arranged upward toward the first patterned conductive layer 22.

Among them, the gate G2 and source S2 of the second power chip 27 are electrically connected to the first patterned conductive layer 22 through two separate the conductive adhesive parts 23-2a and 23-2b, respectively. In addition, the drain D2 of the second power chip 27 is electrically connected to the source S1 of the first power chip 26 through the second patterned conductive layer 31 without the second conductive connecting element 28b-1 shown in FIG. 2A. The electrical conduction path between the second power chip 27 and the first power chip 26 can be shortened to increase electrical performance.

Figure 7:
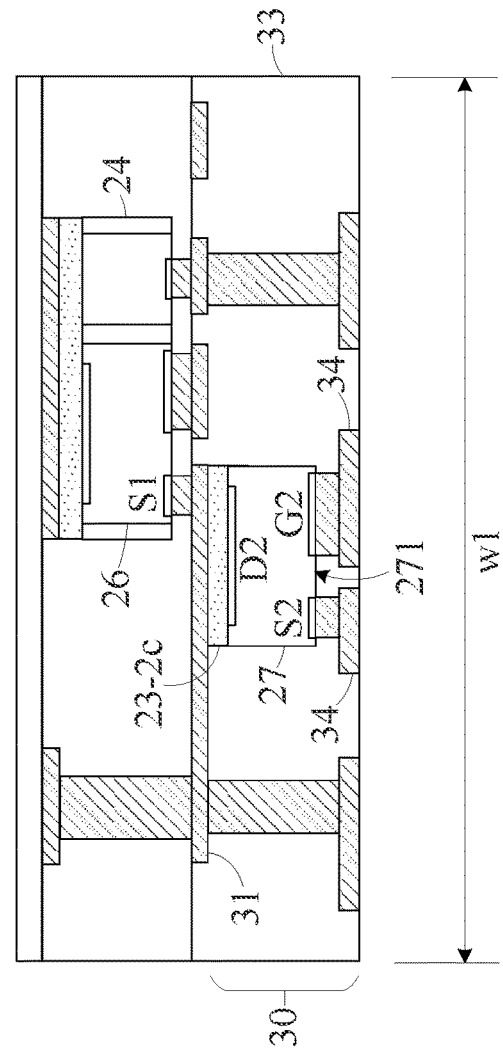
FIG. 7 is a schematic cross-sectional view of the semiconductor package structure according to the third embodiment of the present invention.

FIG. 7 is a schematic cross-sectional view of the semiconductor package structure 4 according to the third embodiment of the present invention. As shown in FIG. 7, compared with the semiconductor package structure 2-1 of the first embodiment, the main difference of the semiconductor package structure 4 of the third embodiment is that the second power chip 27 and the integrated chip 24 are disposed in a vertical stacking manner, and the second power chip 27 is embedded in the second dielectric layer 33 of the second build-up circuit structure 30.

Among them, the second front surface 271 of the second power chip 27 is disposed downwardly toward the direction of the third patterned conductive layer 34, and the drain D2 of the second power chip 27 is disposed on the second patterned conductive layer 31 through the conductive adhesive part 23-2c. Since the drain D2 of the second power chip 27 is directly disposed under the source S1 of the first power chip 26, the electrical conduction path between the second power chip 27 and the first power chip 26 is further shortened. In addition, since the second power chip 27 is stacked under the integrated chip 24, the horizontal length w1 of the semiconductor package structure 4 can be reduced.

In summary, the semiconductor package structure and manufacturing method of the present invention integrates the control chip 25 with the first power chip 26 into a single chip (also called an integrated chip 24) and is co-located within one package structure unit with the second power chip 27. The semiconductor package structure and manufacturing method has the following technical features:

First, the three-chip package ((including the control chip 25, the first power chip 26 and the second power chip 27) is simplified to a two-chip package (the integrated chip 24 and the second power chip 27), and the unit volume of the package structure is further reduced.

Second, the semiconductor process is used to replace the conventional reflow process to greatly improve the accuracy of the package structure.

Third, the reflow process containing lead is discarded in the manufacturing process of the present invention, which can meet the trend of environmental protection and the requirements of laws and regulations.

Fourth, the surfaces of the integrated chip 24 and the second power chip 27 are fixedly disposed on the first patterned conductive layer (or the second patterned conductive layer) through the conductive adhesive part, which can simplify the manufacturing process and can achieve a great heat dissipation effect based on the conductive adhesive part with high heat dissipation material.

The above embodiments merely give the detailed technical contents of the present invention and inventive features thereof, and are not to limit the covered range of the present invention. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A semiconductor package structure, comprising:
   a first dielectric layer, which has a first surface and a second surface arranged opposite to each other;
   a first patterned conductive layer, which is disposed on the second surface of the first dielectric layer;
   an integrated chip, which is embedded in the first dielectric layer, comprising:
   a control chip, which has an active surface and a rear surface, and the rear surface being facing the second surface of the first dielectric layer; and
   a first power chip, which is a High-Side MOSFET and has a first front surface with a first electrode layout and a first rear surface with a second electrode layout, wherein the first power chip is electrically connected and adhered to the first patterned conductive layer through a first conductive adhesive part by the second electrode layout;
   a second power chip, which is a Low-Side MOSFET embedded in the first dielectric layer, and has a second front surface with a third electrode layout and a second rear surface with a fourth electrode layout, wherein the second power chip is electrically connected and adhered to the first patterned conductive layer through a second conductive adhesive part by the fourth electrode layout;
   a second patterned conductive layer, which is disposed on the first surface of the first dielectric layer and is electrically connected to the first electrode layout of the first power chip and the third electrode layout of the second power chip through a plurality of first conductive connecting elements;
   a plurality of second conductive connecting elements, which are electrically connected between the first patterned conductive layer and the second patterned conductive layer; and
   a build-up circuit structure, which is disposed on the first surface of the first dielectric layer and is electrically connected to the second patterned conductive layer.

2. The semiconductor package structure of claim 1, wherein the first electrode layout of the first power chip is the same as the third electrode layout of the second power chip and includes a gate and a source respectively, and the second electrode layout of the first power chip is the same as the fourth electrode layout of the second power chip and includes a drain respectively.

3. The semiconductor package structure of claim 2, wherein the source of the first power chip is electrically connected to the drain of the drain of the second power chip via one of the first conductive connecting elements, the second patterned conductive layer, one of the second conductive connecting elements, the first patterned conductive layer and the first conductive adhesive part.

4. The semiconductor package structure of claim 1, wherein the first electrode layout of the first power chip is the same as the fourth electrode layout of the second power chip and includes a gate and a source respectively, and the second electrode layout of the first power chip is the same as the third electrode layout of the second power chip and includes a drain respectively.

5. The semiconductor package structure of claim 4, wherein the source of the first power chip is electrically connected to the drain of the second power chip through two of the first conductive connecting elements and the second patterned conductive layer.

6. The semiconductor package structure of claim 1, wherein the control chip is a driver chip and the active surface is provided with at least one connecting pad, and the second patterned conductive layer is electrically connected to the connecting pad via one of the first conductive connecting elements.

7. The semiconductor package structure of claim 1, wherein the build-up circuit structure comprising:
   a second dielectric layer, which has a third surface and a fourth surface arranged opposite to each other, and is connected to the first surface of the first dielectric layer by the fourth surface; and
   a third patterned conductive layer, which is disposed on the third surface of the second dielectric layer and is electrically connected to the second patterned conductive layer through a plurality of third conductive connecting elements.

* * * * *